(12) United States Patent
Pendergrass

(10) Patent No.: US 6,969,964 B2
(45) Date of Patent: Nov. 29, 2005

(54) CONTROL DEVICE AND METHOD OF USE

(75) Inventor: Isaac Pendergrass, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2 days.

(21) Appl. No.: 10/765,755

(22) Filed: Jan. 26, 2004

(65) Prior Publication Data

US 2005/0162115 A1   Jul. 28, 2005

(51) Int. Cl.$^7$ ................................................ H02P 1/04
(52) U.S. Cl. ..................... 318/480; 318/283; 318/286; 340/438
(58) Field of Search ................................ 318/280–284, 318/480; 340/435, 545.6, 438, 540, 686.6, 340/545.1; 49/25, 26, 28; 369/75.1; 220/200, 220/211; 250/221, 222.1; 345/863, 156, 345/157; 348/734, 155, 169; 360/92

(56) References Cited

U.S. PATENT DOCUMENTS

| | | | | |
|---|---|---|---|---|
| 4,539,474 A | * | 9/1985 | Takahata ..................... 250/221 |
| 4,823,010 A | * | 4/1989 | Kornbrekke et al. ..... 250/341.7 |
| 4,851,746 A | * | 7/1989 | Milke .......................... 318/467 |
| 4,952,080 A | * | 8/1990 | Boiucaner et al. .......... 388/811 |
| 5,134,292 A | * | 7/1992 | Segawa et al. ............. 250/342 |
| 5,157,564 A | * | 10/1992 | Theobald et al. ............. 360/92 |
| 5,329,212 A | * | 7/1994 | Feigleson .................... 318/16 |
| 5,704,836 A | * | 1/1998 | Norton et al. ................ 463/36 |
| 5,714,698 A | * | 2/1998 | Tokioka et al. ............ 73/865.4 |
| 5,767,842 A | * | 6/1998 | Korth .......................... 345/168 |
| 6,160,678 A | * | 12/2000 | Meikle et al. ................. 360/92 |
| 6,225,768 B1 | * | 5/2001 | Cookson et al. ............. 318/280 |
| 6,225,904 B1 | * | 5/2001 | Jaffe et al. ................ 340/545.6 |
| 6,307,952 B1 | * | 10/2001 | Dietz .......................... 382/107 |
| 6,310,629 B1 | * | 10/2001 | Muthusamy et al. ....... 715/727 |
| 6,359,612 B1 | * | 3/2002 | Peter et al. .................. 345/156 |
| 6,476,999 B1 | * | 11/2002 | Meikle et al. ................. 360/92 |
| 6,498,628 B2 | * | 12/2002 | Iwamura ...................... 348/734 |
| 6,501,515 B1 | * | 12/2002 | Iwamura ...................... 348/734 |
| 6,525,659 B2 | * | 2/2003 | Jaffe et al. ............... 340/545.6 |
| 6,624,833 B1 | * | 9/2003 | Kumar et al. ............... 715/863 |
| 6,750,441 B2 | * | 6/2004 | Imahori et al. ............. 250/221 |
| 6,756,910 B2 | * | 6/2004 | Ohba et al. ............. 340/686.6 |
| 6,782,660 B2 | * | 8/2004 | Takada et al. ................. 49/25 |
| 6,812,837 B2 | * | 11/2004 | Ikeuchi ..................... 340/545.1 |
| 6,859,005 B2 | * | 2/2005 | Boliver ....................... 318/480 |
| 2001/0030606 A1 | * | 10/2001 | Jaffe et al. ............... 340/545.6 |
| 2002/0101348 A1 | * | 8/2002 | Imahori et al. ............. 340/540 |
| 2002/0118114 A1 | * | 8/2002 | Ohba et al. ............. 340/573.1 |
| 2002/0118626 A1 | * | 8/2002 | Sugita et al. ............... 369/75.1 |
| 2002/0135476 A1 | * | 9/2002 | McKinney et al. ......... 340/540 |
| 2002/0157314 A1 | * | 10/2002 | Takada et al. ................. 49/26 |

(Continued)

FOREIGN PATENT DOCUMENTS

DE         4312672 A1 * 10/1994   ............. G06F 3/02

(Continued)

OTHER PUBLICATIONS

"EZ-BEAM Q25 Series Fixed-Field Sensors—DC Output", Banner Engineering Corp., www.baneng.com, Pat. No. 5,087,838 Feb. 1992.

(Continued)

*Primary Examiner*—Paul Ip

(57) ABSTRACT

A control device and method of used includes receiving a signal from a first sensor and receiving a signal from a second sensor after receiving the signal from the first sensor. In response to the received signals, the electronic device executes the function.

15 Claims, 5 Drawing Sheets

U.S. PATENT DOCUMENTS

| | | | |
|---|---|---|---|
| 2003/0076293 A1 * | 4/2003 | Mattsson | 345/156 |
| 2003/0093951 A1 * | 5/2003 | Ikeuchi | 49/31 |
| 2003/0132974 A1 * | 7/2003 | Bodin | 345/863 |
| 2004/0087366 A1 * | 5/2004 | Shum et al. | 463/36 |
| 2004/0174268 A1 * | 9/2004 | Scott et al. | 340/686.6 |
| 2004/0227625 A1 * | 11/2004 | Joehl et al. | 340/438 |
| 2004/0257020 A1 * | 12/2004 | Boliver | 318/480 |
| 2005/0017663 A1 * | 1/2005 | Anderson et al. | 318/280 |
| 2005/0073425 A1 * | 4/2005 | Snell et al. | 340/686.6 |
| 2005/0121602 A1 * | 6/2005 | Peng et al. | 250/221 |

FOREIGN PATENT DOCUMENTS

| | | | | |
|---|---|---|---|---|
| DE | 19845030 A1 * | 4/2000 | | G06F 3/00 |
| DE | 10022321 A1 * | 11/2001 | | B60R 16/02 |
| JP | 10236243 A * | 9/1998 | | B60R 16/02 |

OTHER PUBLICATIONS

"Integrated Circuits Data Sheet", Philips Semiconductors, Feb. 14, 2003.

* cited by examiner

CONTROL DEVICE AND METHOD OF USE

BACKGROUND OF THE INVENTION

In many industrial, medical, and household environments, a sensor may be used to detect the presence of one or more individuals and initiate a process based on this detection. One example of this can be found at many stores and other buildings where an entrance or exit is controlled by a detector that senses the presence of an individual within the field-of-view of the sensor. This provides customers with a hands-free ability to enter and exit the building.

However, in many instances, the sensor responds to the presence of an individual regardless of the direction in which the individual is moving. Thus, the entrance to the store may be activated by an individual merely passing within range of the sensor, regardless of whether the individual is moving toward the entrance. This can cause the entrance door to be activated again and again without a single customer entering the store, thereby causing unnecessary wear and tear to the electrical and mechanical components of the door.

DESCRIPTION OF THE EMBODIMENTS

Control of a device through detection of motion in a particular direction provides a convenient way of performing a number of control functions, including opening and closing doors, by way of simple user actions, such as the wave of a hand in a particular direction and within range of two or more sensors. In an embodiment such as that of FIG. 1, when the user waves a hand first within range of a first sensor and then within range of a second sensor, a media door (into which the user may insert compact discs or digital versatile discs) may be changed from an open state to a closed state, or from a closed state to an open state. A second wave of the hand in the same direction reverses the state of the media door, thereby closing the door. In a similar manner, when the user waves a hand first within range of the second sensor and then within range of the first sensor, a second media door can be changed from a closed to an open state. A second wave of the hand first within range of the second sensor and then within range of the first sensor reverses the state of the second media door, thereby closing the door.

Figure 1:
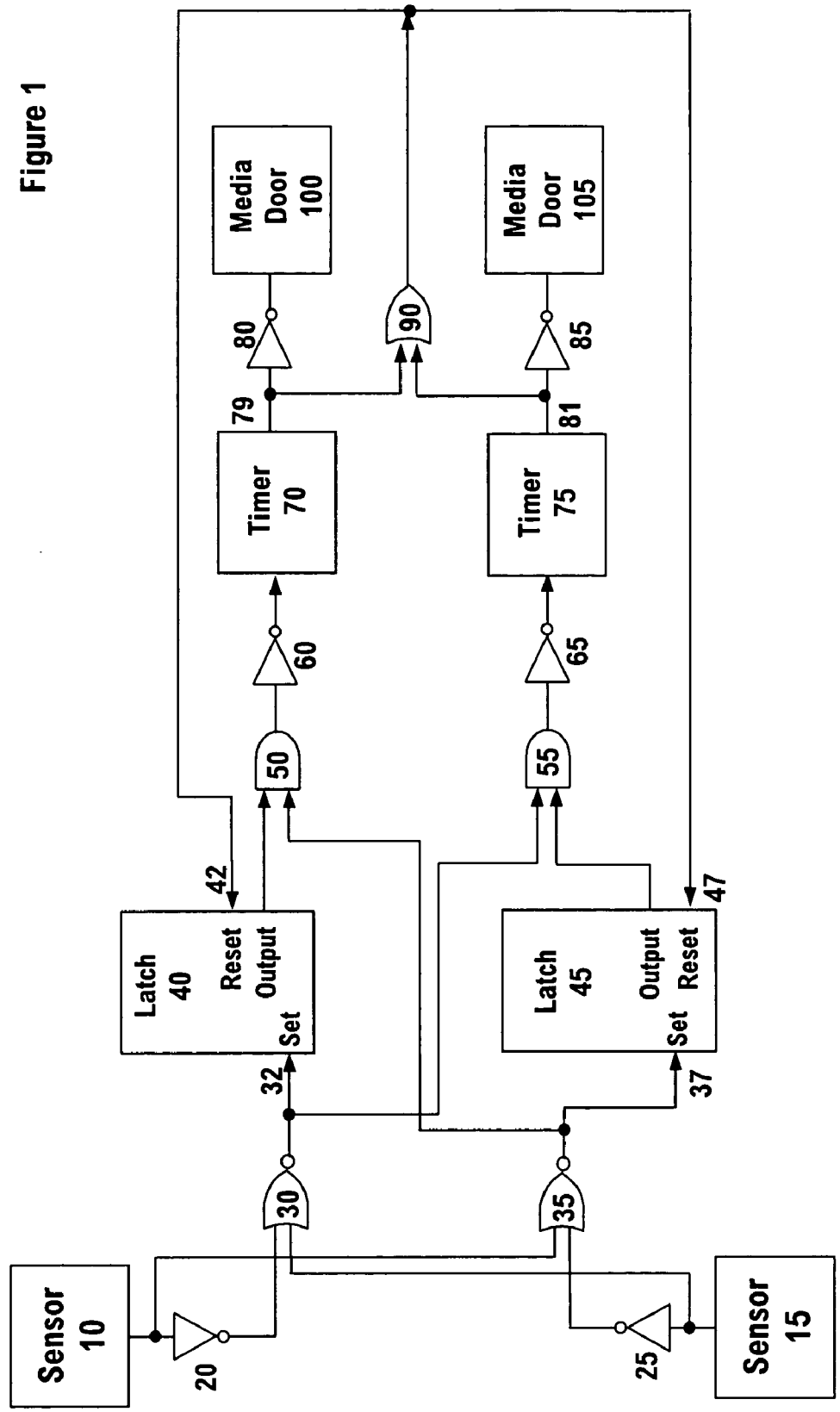
FIG. 1 is a diagram of a control device that controls the drive bay doors of a computing device according to an embodiment of the invention.

FIG. 1 is a diagram of a control device that controls the compact disc (CD) and digital versatile disc (DVD) drives of a computing device according to an embodiment of the invention. In FIG. 1, sensors 10 and 15 are contemplated as being active infrared sensors that transmit and receive infrared energy at a wavelength of approximately 880 nm. The sensors are mounted on an outer surface of the computing device approximately 15 centimeters apart in a manner that allows a user to wave his or her hand in a continuous motion first within range of sensor 10 and then within range of sensor 15, or first within range of sensor 15 and then within range of sensor 10 (in a continuous motion). Sensors 10 and 15 are arranged such that when the user's hand is within range of sensor 10, sensor 15 does not respond. Further, when the user's hand is within range of sensor 15, sensor 10 does not respond. In the context of the present invention, the term "electronic device" is contemplated as encompassing a broad range of laptop and desktop computers and computing devices, entertainment and multimedia devices such as CD players, DVD players, stereo receivers and amplifiers, lighting controllers, automatic building entrance and exit doors, as well as numerous other types of devices.

In the embodiment of FIG. 1, when a user's hand comes within 25 to 100 millimeters of sensor 10, the sensor responds with a signal (logic 1) to inverter 20 and to NOR gate 35. Inverter 20, in response to the logic 1, conveys a logic 0 to NOR gate 30. Since the user's hand is out of range of sensor 15, a logic 0 is present at the second input to NOR gate 30. NOR gate 30, in response to the two logic 0 inputs, produces a logic 1 and conveys the logic 1 to input 32 of latch 40. Input 32 is contemplated as being the "set" input to the latch. In response to the logic 1 input, latch 40 produces a logic 1 and conveys the signal to AND gate 50. At this point, latch 40 maintains the logic 1 output to AND gate 50 regardless of the output of NOR gate 30.

As the user's hand moves out of range of sensor 10, the sensor conveys a logic 0 to inverter 20. Inverter 20, in response to the logic 0, conveys a logic 1 to NOR gate 30. In response to the logic 1, NOR gate 30 conveys a logic 0 to set input 32 of latch 40. However, as the output of latch 40 has already been set to logic 1, the logic 0 present at set line 32 does not affect the latch output to AND gate 50.

As the user's hand comes within range of sensor 15 (and remains out of range of sensor 10), sensor 15 responds with a signal (logic 1) to inverter 25. Inverter 25, in response to the logic 1, conveys a logic 0 to NOR gate 35 and a logic 1 to NOR gate 30. In response to the logic 0 from inverter 25 and the logic 0 from sensor 10, NOR gate 35 produces a logic 1 at the second input of AND gate 50. With both inputs to AND gate 50 being logic 1, AND gate 50 outputs a logic 1 to inverter 60, which produces the logic 0 signal that triggers timer 70. Timer 70 then produces a logic 1 at output 79, which is conveyed to inverter 80 and OR gate 90.

In the embodiment of FIG. 1, timer 70 maintains a logic 1 at output 79 for time delay of approximately 0.2 seconds, which is sufficient to trigger the door circuitry responsible for opening and closing a CD/DVD drive bay door in many desktop computing devices. However, as shown in more detail in FIG. 3, timer 70 can be controlled to maintain a logic 1 for a shorter or longer duration. In the embodiment of FIG. 1, media door 100 responds to a logic 0 (active low) in order to open or close the media door, thereby allowing the user to insert or remove an optical storage media (such as CDs or DVDs). For those embodiments in which an active high signal controls the door that provides access to removable media, inverter 80 need not be present, and media door 100 can be activated directly from timer 70.

Returning to the embodiment of FIG. 1, as the user's hand remains out of range of both sensors 10 and 15, the outputs of inverters 20 and 25 assume a logic 1. Thus, NOR gate 30 maintains a logic 0 on set line 32 of latch 40. While the logic 0 is present at set line 32, latch 40 is reset by way of reset input 42 from OR gate 90. With latch 40 now reset to convey a logic 0 to AND gate 50, AND gate 50 responds with a logic 0 to inverter 60. Inverter 60, in turn, switches from conveying a logic 0 to timer 70 and begins conveying a logic 1. With a logic 1 at the input of timer 70, the timer soon (0.2 seconds) returns to a quiescent state in which output 79 is returned to logic 0. Inverter 80 then outputs a logic 1, thus deactivating media door 100.

The device of FIG. 1 can also be used to control media door 105 by way of the user waving his or her hand first within range of sensor 15, and then within range of sensor 10. The operation of inverter 25, NOR gate 35, latch 45 (including set line 37 and reset line 47), AND gate 55, and inverters 65 and 85, timer 75 (including output 81), and media door 105 function substantially the same as their previously discussed counterparts. Thus, the opening and closing media door 100, and media door 105 can be controlled by the user waving his or her hand in a particular direction first within range of sensor 15 and then in range of sensor 10.

The basic device of FIG. 1 can be used to control a variety of electronic devices other than computing device media doors. In one embodiment, an AM/FM radio may be controlled, wherein a wave of the hand in one direction activates the AM radio. A wave of the hand in another direction activates the FM radio. In another embodiment, a wave of the hand in one direction controls the On/Off state of a room light. The wave of the hand in another direction controls the state of a second room light. An automatic door to a building can also be controlled by an individual walking within range of a first sensor and then within range of a second sensor.

Figure 2:
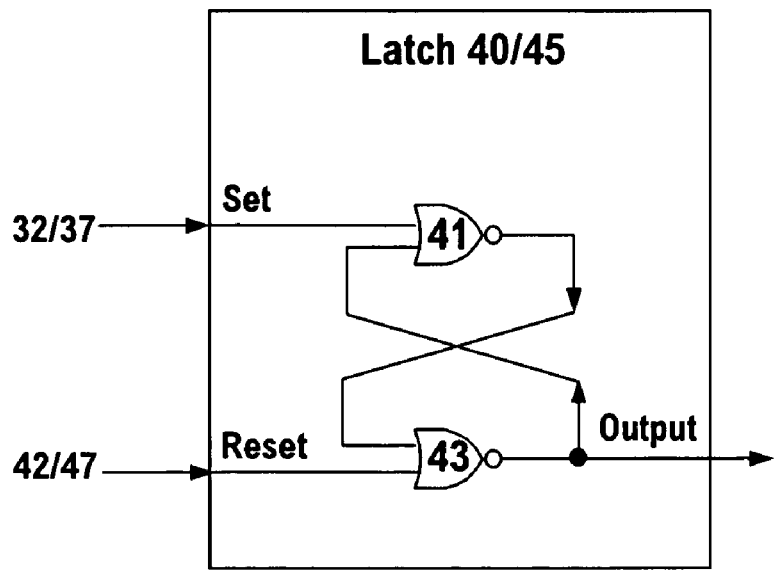
FIG. 2 is a diagram of latches 40 and 45 used in the control device of FIG. 1 according to an embodiment of the invention.

FIG. 2 is a diagram of latches 40 and 45 used in the control device of FIG. 1 according to an embodiment of the invention. Those of skill in the art will recognize the latch as consisting of two NOR gates (41 and 43) having a set input 32, and a reset input 42.

Figure 3:
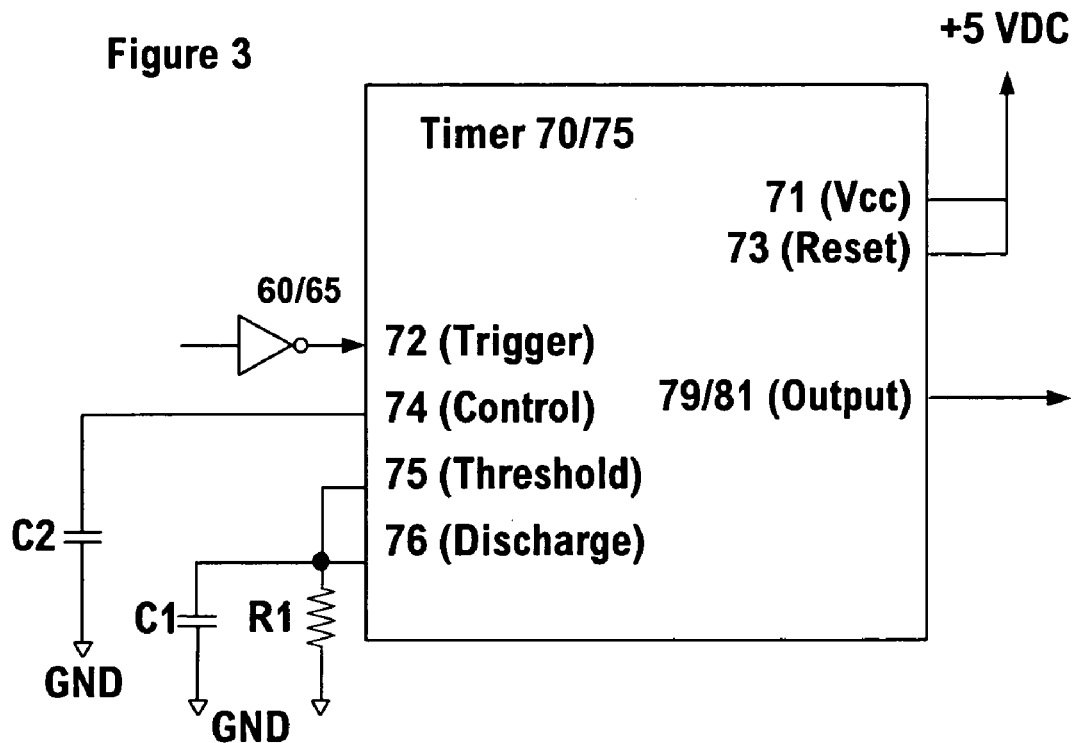
FIG. 3 is a diagram showing the electrical connections of timers 70 and 75 of FIG. 1 according to an embodiment of the invention.

FIG. 3 is a diagram showing the electrical connections of timers 70 and 75 of FIG. 1 according to an embodiment of the invention. In FIG. 3, a Philips NE/SA/SE555/SE555C monolithic timing circuit performs the timing function. In this embodiment, inputs 71 (Vcc) and 73 (reset) are both tied to a 5 VDC input. Trigger input 72 represents the signal conveyed to the timer from inverter 60/65. Control input 74 is attached to a 10 nanofarad capacitor (C2) in order to mitigate the effects of any high frequency noise that may affect the operation of the timer. The timing circuit of FIG. 3 also includes threshold input 75, and discharge input 76. In accordance with the applicable product data sheet, the monolithic timing circuit provides a time delay that is controlled by the RC time constant of R1 and C1. In order to achieve the 0.2 second timing delay discussed with reference to FIG. 1, R1 is contemplated as being a 2-MegOhm resistor, and C1 is contemplated as being a 0.1-microfarad capacitor.

In other embodiments, R1 and C1 may assume a variety of other values. For example, where sensors 10 and 15 are used to control the opening and closing of an entrance to a building, R1 and C1 may be chosen to provide a more substantial time delay, such as 0.5 seconds or more. In another example, where objects may move within range of sensors 10 and 15 much more rapidly, a much smaller RC time constant may be desirable.

Although the embodiments of FIGS. 1–3 include the use of discrete components, such as inverters, latches, and discrete timers, it is contemplated that most if not all of the discrete devices (other than sensors 10 and 15) can be performed using a single logic module that includes either hardware or software elements. Thus, embodiments of the invention may include sensors 10 and 15 mounted on a surface of a computing device. An output of each sensor is then conveyed to a software module of the operating system dedicated to executing a control function, such as opening and closing one or more media doors.

Figure 4:
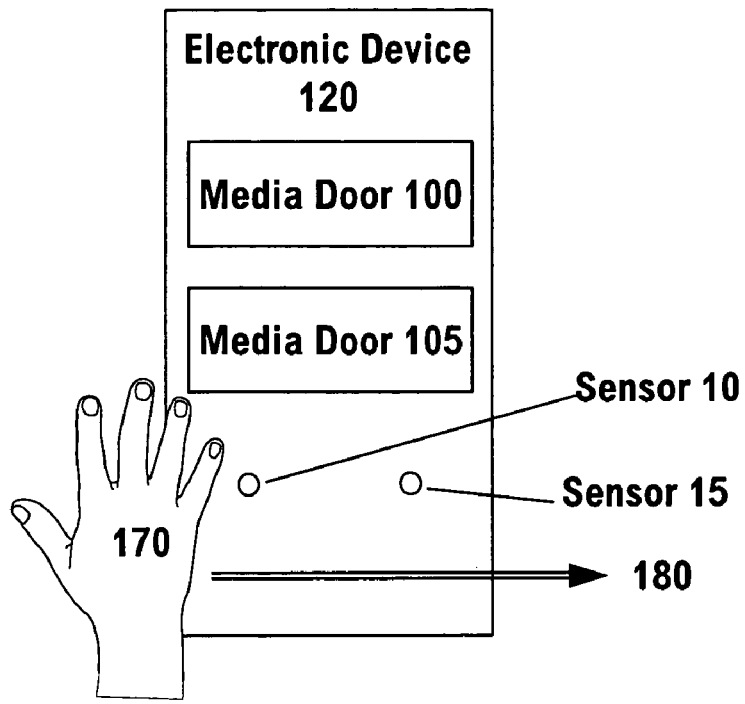
FIGS. 4 and 5 show a user moving his or her hand within range of two sensors mounted on a computing device according to an embodiment of the invention.

FIG. 4 is a diagram showing a user moving his or her hand within range of two sensors mounted on electronic device 120 according to an embodiment of the invention. In FIG. 4, media doors 100 and 105 represent drive bay doors that allow a user to insert and remove CDs and/or DVDs from a computing device. As shown in the figure, a user's hand 170 is moved first within range of sensor 10, then within range of sensor 15 along direction 180. In a first continuous motion along direction 180, media door 100 may be opened. In a second continuous motion along direction 180, media door 100 may be closed.

Figure 5:
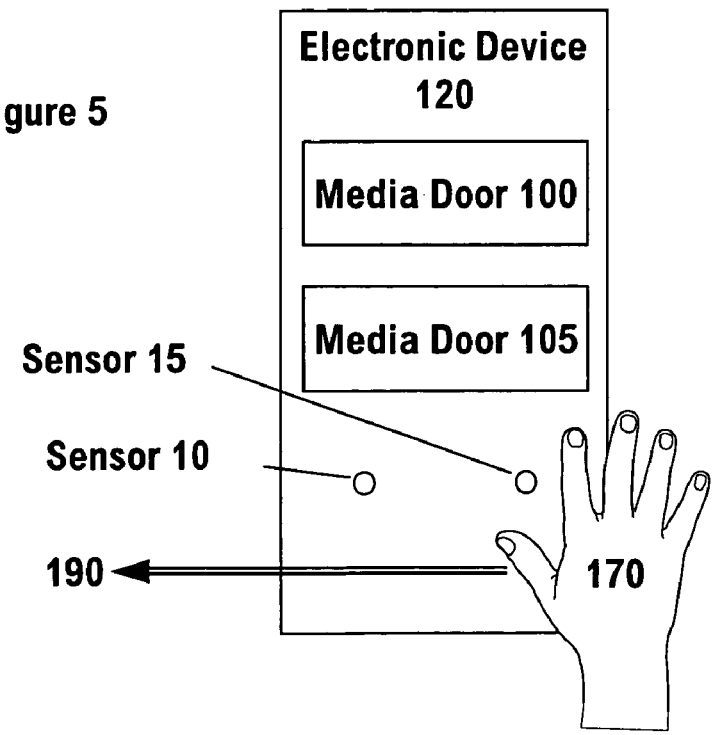

FIG. 5 is a diagram showing a user moving his or her hand in the direction opposite the direction shown in FIG. 4 according to an embodiment of the invention. In FIG. 5, a user's hand 170 is moved first within range of sensor 15, then within range of sensor 10 along direction 190. In a first motion along direction 190, media door 105 may be opened. In a second motion along vector 190, media door 105 may be closed.

Figure 6:
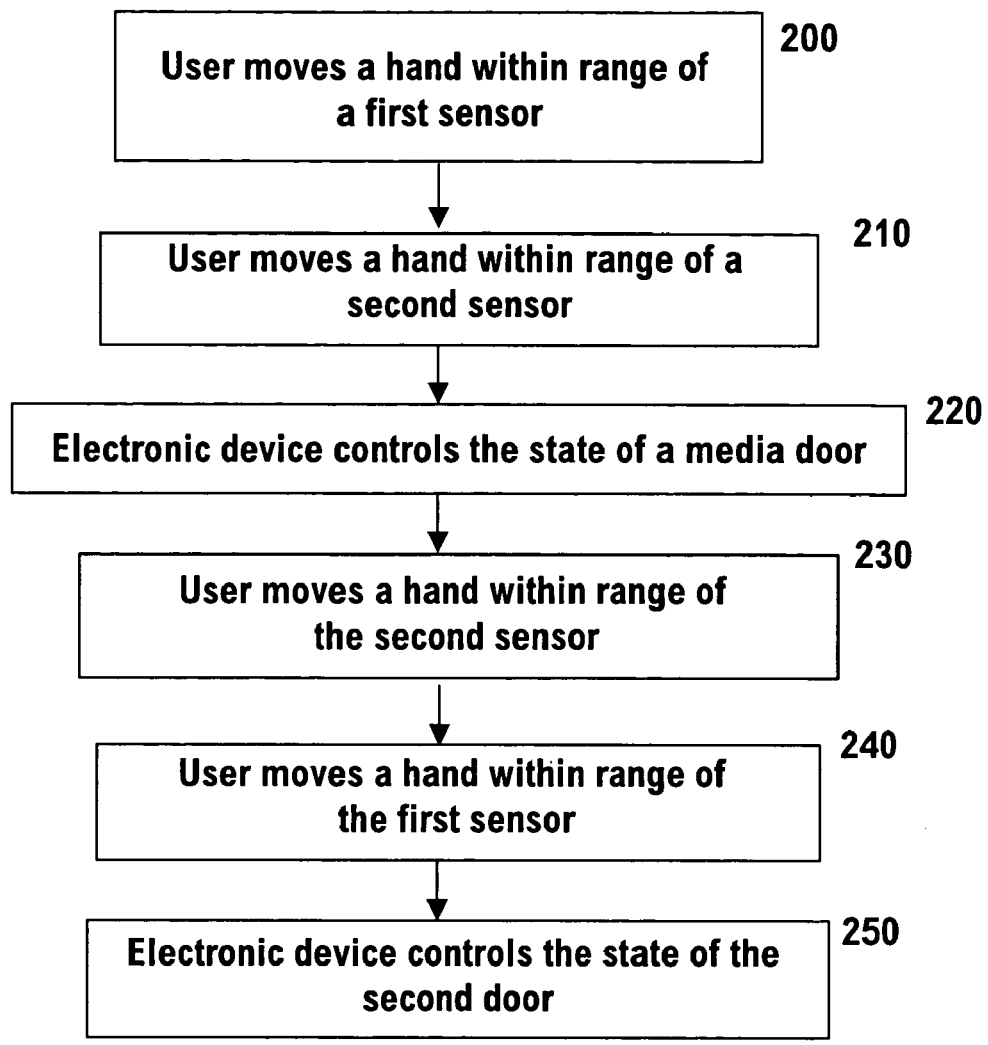
FIG. 6 is a flowchart for a method for controlling an electronic device according to an embodiment of the invention.

FIG. 6 is a flowchart of a method for controlling an electronic device according to an embodiment of the invention. The apparatus of FIGS. 1–5 may be suitable for performing the method of FIG. 6. The method of FIG. 6 begins at step 200, in which a user moves a hand within range of a first sensor, such as sensor 10 of FIG. 1. At step 210, the user moves the hand within range of a second sensor, such as sensor 15 of FIG. 1. At step 220, the electronic device responds by executing a control function. The control function executed in step 220 can be one of many functions, such as changing the state of a CD drive door from a closed state to an open state, or from an open state to a closed state. In another embodiment, the electronic device may be a stereo amplifier that includes AM/FM receiver inputs as well as inputs from external devices. In this embodiment, the control function may be the selection of a particular audio or multimedia input to be amplified.

Some embodiments of the invention may only include steps 200–220 as described above. However, other embodiments of the invention may additionally include step 230, in which the user moves his or her hand in the opposite direction first within range of the second sensor, and then within in range of the first sensor (as in step 240). In response to the signals from the second sensor and then the first sensor, the electronic device executes a second function as in step 250. This may include the electronic device opening a second media door, such as a DVD drive of a computing device. In other embodiments of the invention, such as when the electronic device is a stereo amplifier, the second control function may be changing a radio preset, changing a music selection, and so forth.

Figure 7:
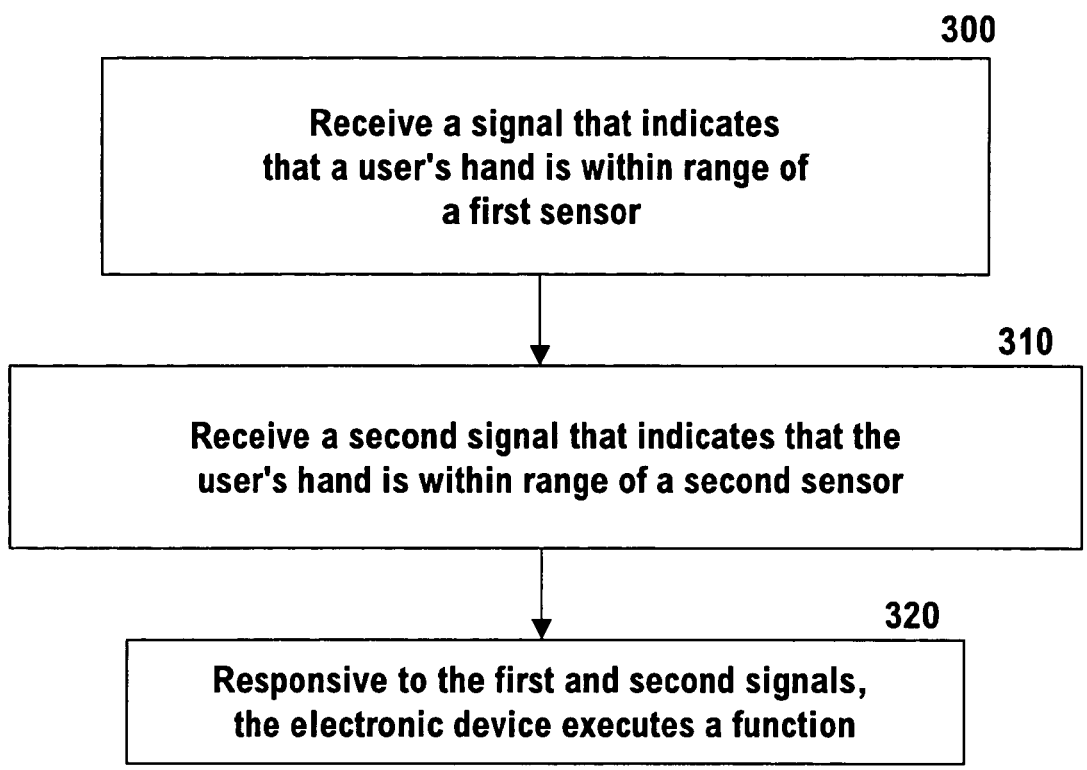
FIG. 7 is a flowchart for a method for controlling an electronic device according to another embodiment of the invention.

FIG. 7 is a flowchart of a method for controlling an electronic device according to an embodiment of the invention. The apparatus of FIGS. 1–5 may be suitable for performing the method of FIG. 7. The method of FIG. 7 begins at step 300 in which a signal that indicates that a user's hand is within range of a first sensor is received. The method continues at step 310, in which a second signal, indicating that the user's hand is within range of a second sensor, is received. The method continues with step 320, in which, responsive to the first and second signals, the electronic device executes a function.

The method of FIG. 7 can be stored on one or more computer readable media, such a removable disk, or stored on a memory media located within the computer, which, when executed by the computer cause the computer to execute steps 300–320. The method FIG. 7 can also be stored in the firmware or other memory media that is permanently resident within the computer.

While the present invention has been particularly shown and described with reference to the foregoing preferred and alternative embodiments, those skilled in the art will understand that many variations may be made therein without departing from the spirit and scope of the invention as defined in the following claims. This description of the invention should be understood to include all novel and non-obvious combinations of elements described herein, and claims may be presented in this or a later application to any novel and non-obvious combination of these elements. The foregoing embodiments are illustrative, and no single feature or element is essential to all possible combinations that may be claimed in this or a later application. Where the claims recite "a" or "a first" element of the equivalent thereof, such claims should be understood to include incorporation of one or more such elements, neither requiring nor excluding two or more such elements.

What is claimed is:

1. A method for opening and closing a media door, comprising:
   a user moving a hand within range of a first sensor;
   the user moving the hand within range of a second sensor;
   a latching and timing device controlling the opening state of the media door in response to the hand moving within range of the first sensor followed by moving the hand within range of the second sensor;
   the user moving the hand within range of the first sensor for a second time;
   the user moving the hand within range of the second sensor for a second time; and
   the latching and timing device closing the media door in response to the hand moving within range of the first sensor for a second time followed by moving the hand within range of the second sensor for a second time.

2. The method of claim 1, wherein at least one of the first and second sensors is an infrared sensor.

3. The method of claim 2, wherein the first moving step further comprises the user moving the hand to within 100 millimeters of the first sensor.

4. The method of claim 1, further comprising:
   the user moving the hand within range of the second sensor;
   the user moving the hand within range of the first sensor, wherein
   responsive to the hand moving within range of the second sensor followed by moving within range of the first sensor causes the latching and timing device to control the state of a second media door.

5. The method of claim 1, wherein the latching and timing device performs computing functions.

6. The method of claim 1, wherein the latching and timing device performs entertainment functions.

7. An electronic device, comprising:
   a media door;
   first and second sensors disposed on a surface of the electronic device;
   a latching and timing module coupled to the media door and to the first and second sensors, wherein
   the logic module receives a first signal from the first sensor, followed by a first signal from the second sensor, and, responsive to the signals from the first and second sensors, opens the media door, and wherein
   the logic module receives a second signal from the first sensor, followed by a second signal from the second sensor, and, responsive to the second signals from the first and second sensors, closes the media door.

8. The electronic device of claim 7, further comprising:
   a second media door, wherein
   the logic module receives an additional signal from the second sensor, followed by an additional signal from the first sensor, and, responsive to the additional signals, opens the second media door.

9. The electronic device of claim 7, wherein the first and second sensors respond to energy captured at infrared wavelengths.

10. The electronic device of claim 7, wherein the media door accepts an optical storage media.

11. In an electronic device, a method for controlling a door, comprising:
    receiving a first signal from a first sensor;
    receiving a first signal from a second sensor after receiving the signal from the first sensor; receiving a first latching and timing signal opening the door responsive to the received signals;
    receiving a second signal from the first sensor;
    receiving a second signal from the second sensor after receiving the second signal from the first sensor; and receiving a second latching and timing signal
    closing the door responsive to the received signals.

12. The electronic device of claim 11, wherein receiving the signal from the first sensor followed by receiving the signal from the second sensor opens the door, and wherein receiving the signal from the second sensor followed by receiving the signal from the first sensor opens a second door.

13. The electronic device of claim 11, wherein the door controls access to removable media used by the electronic device.

14. The electronic device of claim 13, wherein the electronic device is one of a computing device and an entertainment device.

15. The electronic device of claim 11, wherein the first and second sensors are infrared sensors.

* * * * *